US009580835B2

(12) United States Patent
Ranish et al.

(10) Patent No.: US 9,580,835 B2
(45) Date of Patent: *Feb. 28, 2017

(54) MULTIZONE CONTROL OF LAMPS IN A CONICAL LAMPHEAD USING PYROMETERS

(71) Applicant: Applied Materials, Inc., Santa Clara, CA (US)

(72) Inventors: Joseph M. Ranish, San Jose, CA (US); Paul Brillhart, Pleasanton, CA (US); Jose Antonio Marin, San Jose, CA (US); Satheesh Kuppurao, San Jose, CA (US); Balasubramanian Ramachandran, Cupertino, CA (US); Swaminathan T. Srinivasan, Pleaseanton, CA (US); Mehmet Tugrul Samir, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/987,446

(22) Filed: Jan. 4, 2016

(65) Prior Publication Data
US 2016/0138188 A1    May 19, 2016

Related U.S. Application Data

(63) Continuation of application No. 14/292,300, filed on May 30, 2014, now Pat. No. 9,230,837, which is a
(Continued)

(51) Int. Cl.
*C30B 25/10* (2006.01)
*H01L 21/67* (2006.01)
(Continued)

(52) U.S. Cl.
CPC ............ *C30B 25/105* (2013.01); *C30B 25/08* (2013.01); *C30B 25/14* (2013.01); *C30B 25/16* (2013.01);
(Continued)

(58) Field of Classification Search
CPC ....... C30B 25/105; C30B 25/08; C30B 25/14; C30B 25/16; H01L 21/0262; H01L 21/67115; H01L 21/67248; H01L 22/20
See application file for complete search history.

(56) References Cited

U.S. PATENT DOCUMENTS 4,919,542 A    4/1990 Nulman et al.
5,108,792 A    4/1992 Anderson et al.
(Continued)

FOREIGN PATENT DOCUMENTS

KR    10-2009-0091650    8/2009

*Primary Examiner* — Karen Kusumakar
(74) *Attorney, Agent, or Firm* — Patterson + Sheridan, LLP

(57) ABSTRACT

A method and apparatus for processing a semiconductor substrate is described. The apparatus is a process chamber having an optically transparent upper dome and lower dome. Vacuum is maintained in the process chamber during processing. The upper dome is thermally controlled by flowing a thermal control fluid along the upper dome outside the processing region. Thermal lamps are positioned proximate the lower dome, and thermal sensors are disposed among the lamps. The lamps are powered in zones, and a controller adjusts power to the lamp zones based on data received from the thermal sensors.

9 Claims, 2 Drawing Sheets

Related U.S. Application Data continuation of application No. 13/796,169, filed on Mar. 12, 2013, now Pat. No. 8,772,055.

(60) Provisional application No. 61/753,002, filed on Jan. 16, 2013, provisional application No. 61/753,305, filed on Jan. 16, 2013.

(51) Int. Cl.
*H01L 21/02* (2006.01)
*C30B 25/08* (2006.01)
*C30B 25/14* (2006.01)
*C30B 25/16* (2006.01)
*G01J 5/10* (2006.01)
*H01L 21/66* (2006.01)

(52) U.S. Cl.
CPC ............ *G01J 5/10* (2013.01); *H01L 21/0262* (2013.01); *H01L 21/67115* (2013.01); *H01L 21/67248* (2013.01); *H01L 22/20* (2013.01)

(56) References Cited

U.S. PATENT DOCUMENTS

| | | |
|---|---|---|
| 5,258,824 A | 11/1993 | Carlson et al. |
| 5,444,815 A | 8/1995 | Lee et al. |
| 5,650,082 A | 7/1997 | Anderson |
| 5,938,335 A | 8/1999 | Yam |
| 6,064,799 A | 5/2000 | Anderson et al. |
| 6,437,290 B1 | 8/2002 | Shao et al. |
| 6,441,350 B1 | 8/2002 | Stoddard et al. |
| 6,458,607 B1 | 10/2002 | Rangarajan et al. |
| 6,488,407 B1 | 12/2002 | Kitamura et al. |
| 2004/0185680 A1* | 9/2004 | Hauf ............... C23C 16/481 438/795 |
| 2005/0115945 A1 | 6/2005 | Kesteren et al. |
| 2006/0027558 A1 | 2/2006 | Hauf |
| 2007/0238202 A1 | 10/2007 | Ranish et al. |
| 2008/0090309 A1 | 4/2008 | Ranish et al. |
| 2009/0211523 A1 | 8/2009 | Kuppurao et al. |
| 2009/0314309 A1 | 12/2009 | Sankarakrishnan et al. |
| 2011/0123178 A1 | 5/2011 | Aderhold et al. |
| 2011/0259432 A1 | 10/2011 | Carlson et al. |

\* cited by examiner

MULTIZONE CONTROL OF LAMPS IN A CONICAL LAMPHEAD USING PYROMETERS

CROSS-REFERENCE TO RELATED APPLICATIONS

This application is a continuation application of U.S. patent application Ser. No. 14/292,300 filed May 30, 2014 which is also a continuation of co-pending U.S. patent application Ser. No. 13/796,169 filed Mar. 12, 2013, now granted as U.S. Pat. No. 8,772,055, which claims benefit of U.S. Provisional Patent Application Ser. No. 61/753,002, filed Jan. 16, 2013 and U.S. Provisional Patent Application Ser. No. 61/753,305, filed Jan. 16, 2013. Each of the aforementioned patent applications is incorporated herein by reference.

FIELD

Methods and apparatus for semiconductor processing are disclosed herein. More specifically, embodiments disclosed herein relate to methods and apparatus for zoned temperature control in an epitaxy process.

BACKGROUND

Epitaxy is a process that is used extensively in semiconductor processing to form very thin material layers on semiconductor substrates. These layers frequently define some of the smallest features of a semiconductor device, and they may have a high quality crystal structure if the electrical properties of crystalline materials are desired. A deposition precursor is normally provided to a processing chamber in which a substrate is disposed, the substrate is heated to a temperature that favors growth of a material layer having desired properties.

It is usually desired that the film have very uniform thickness, composition, and structure. Because of variations in local substrate temperature, gas flows, and precursor concentrations, it is quite challenging to form films having uniform and repeatable properties. The processing chamber is normally a vessel capable of maintaining high vacuum, typically below 10 Torr, and heat is normally provided by heat lamps positioned outside the vessel to avoid introducing contaminants. Control of substrate temperature, and therefore of local layer formation conditions, is complicated by thermal absorptions and emissions of chamber components and exposure of sensors and chamber surfaces to film forming conditions inside the processing chamber. There remains a need for a epitaxy chamber with improved temperature control, and methods of operating such a chamber to improve uniformity and repeatability.

SUMMARY

Embodiments described herein provide a substrate processing apparatus that includes a vacuum chamber comprising a transparent dome and a transparent floor, a substrate support disposed inside the vacuum chamber, a plurality of thermal lamps arranged in a lamphead and positioned proximate the transparent floor of the vacuum chamber, a plurality of thermal sensors disposed within the lamphead and oriented to receive thermal radiation from an area proximate the substrate support, a plurality of power supplies coupled to the thermal lamps in relation to the position of the thermal sensors, and a controller that adjusts the power supplies based on input from the thermal sensors. The transparent dome and transparent floor may be quartz. The substrate support may be a platter-like member with low thermal mass, or a ring-like member.

Other embodiments described herein provide methods of processing a substrate by disposing the substrate in a chamber having a transparent floor, heating the substrate by transmitting radiation from a plurality of lamps through the transparent floor, depositing a layer on the substrate by flowing a precursor gas across the substrate substantially parallel to a surface of the substrate, detecting a first temperature at a first zone of the substrate using a first sensor disposed proximate the transparent floor, detecting a second temperature at a second zone of the substrate using a second sensor disposed proximate the transparent floor, adjusting power to a first portion of the plurality of lamps based on the first temperature, and adjusting power to a second portion of the plurality of lamps based on the second temperature. Following processing, the substrate may be removed, and a cleaning gas having chlorine, bromine, or iodine may be provided to the chamber to remove deposits.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

A chamber capable of zoned temperature control of a substrate while performing an epitaxy process has a processing vessel with an upper portion, a side portion, and a lower portion all made of a material having the capability to maintain its shape when high vacuum is established within the vessel. At least the lower portion is transparent to thermal radiation, and thermal lamps are positioned in a conical lamphead structure coupled to the lower portion of the processing vessel on the outside thereof. Thermal sensors are disposed at various locations inside the processing vessel with means for reducing thermal noise into the sensors and material deposition on the sensors.

Figure 1:
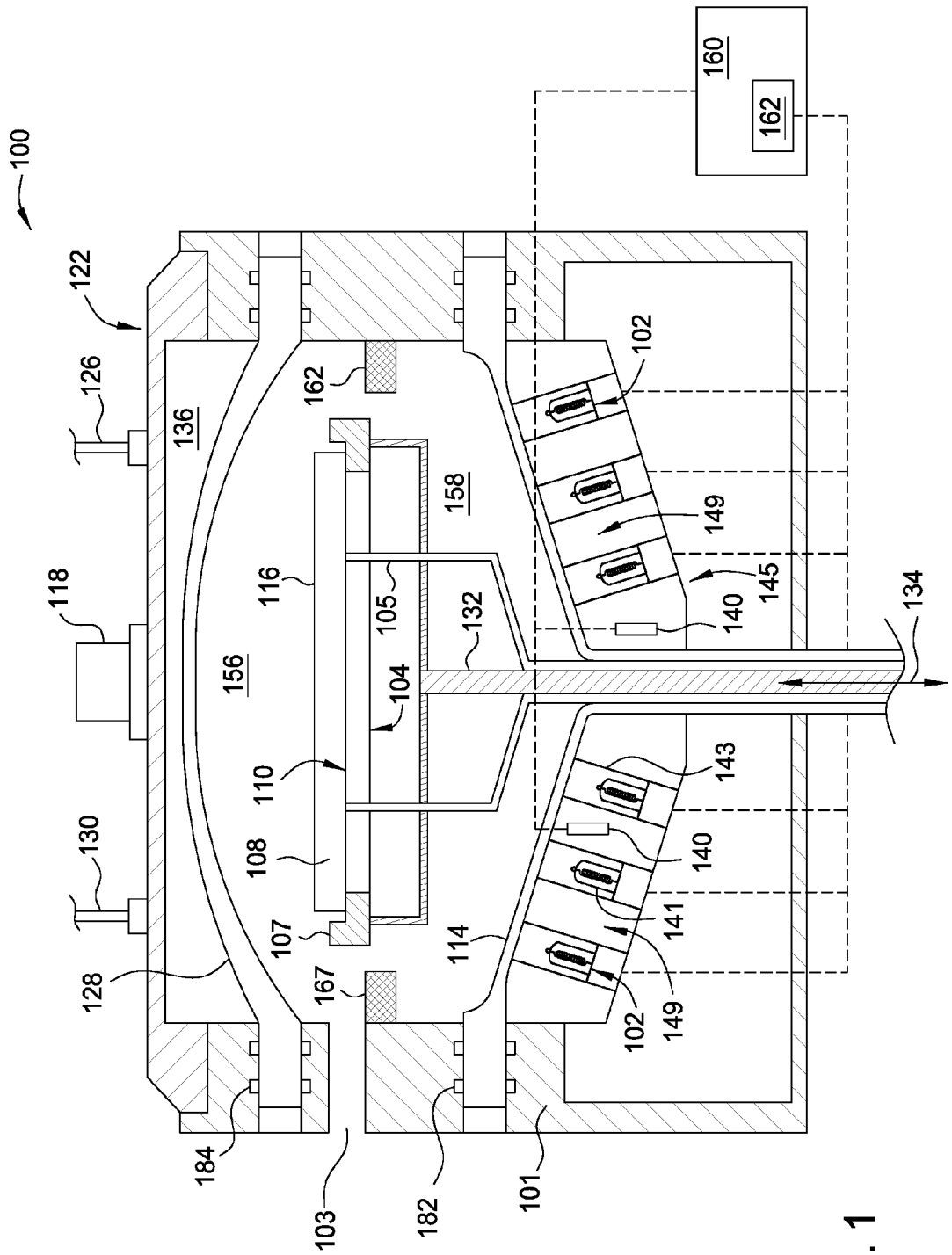
FIG. 1 is a schematic cross-sectional view of a process chamber according to one embodiment.

FIG. 1 is a schematic cross-sectional view of a process chamber 100 according to one embodiment. The process chamber 100 may be used to process one or more substrates, including the deposition of a material on an upper surface of a substrate 108. The process chamber 100 generally includes an array of radiant heating lamps 102 for heating, among other components, a back side 104 of a substrate support 107 disposed within the process chamber 100. The substrate support 107 may be a ring-like substrate support as shown, which supports the substrate from the edge of the substrate, a disk-like or platter-like substrate support, or a plurality of pins, for example three pins. The substrate support 107 is located within the process chamber 100 between an upper dome 128 and a lower dome 114. The substrate 108 (not to scale) can be brought into the process chamber 100 and positioned onto the substrate support 107 through a loading port 103.

The substrate support 107 is shown in an elevated processing position, but may be vertically traversed by an actuator (not shown) to a loading position below the processing position to allow lift pins 105 to contact the lower dome 114, passing through holes in the substrate support 107, and raise the substrate 108 from the substrate support 107. A robot (not shown) may then enter the process chamber 100 to engage and remove the substrate 108 therefrom though the loading port 103. The substrate support 107 then may be actuated up to the processing position to place the substrate 108, with its device side 116 facing up, on a front side 110 of the substrate support 107.

The substrate support 107, while located in the processing position, divides the internal volume of the process chamber 100 into a process gas region 156 (above the substrate) and a purge gas region 158 (below the substrate support 107). The substrate support 107 is rotated during processing by a central shaft 132 to minimize the effect of thermal and process gas flow spatial anomalies within the process chamber 100 and thus facilitate uniform processing of the substrate 108. The substrate support 107 is supported by the central shaft 132, which moves the substrate 108 in an up and down direction 134 during loading and unloading, and in some instances, processing of the substrate 108. The substrate support 107 is typically formed from a material having low thermal mass or low heat capacity, so that energy absorbed and emitted by the substrate support 107 is minimized. The substrate support 107 may be formed from silicon carbide or graphite coated with silicon carbide to absorb radiant energy from the lamps 102 and conduct the radiant energy to the substrate 108. The substrate support 107 is shown in FIG. 1 as a ring with a central opening to facilitate exposure of the substrate to the thermal radiation from the lamps 102. The substrate support 107 may also be a platter-like member with no central opening.

In general, the upper dome 128 and the lower dome 114 are typically formed from an optically transparent material such as quartz. The upper dome 128 and the lower dome 114 are thin to minimize thermal memory, typically having a thickness between about 3 mm and about 10 mm, for example about 4 mm. The upper dome 128 may be thermally controlled by introducing a thermal control fluid, such as a cooling gas, through an inlet portal 126 into a thermal control space 136, and withdrawing the thermal control fluid through an exit portal 130. In some embodiments, a cooling fluid circulating through the thermal control space 136 may reduce deposition on an inner surface of the upper dome 128.

One or more lamps, such as an array of lamps 102, can be disposed adjacent to and beneath the lower dome 114 in a specified, optimal desired manner around the central shaft 132 to heat the substrate 108 as the process gas passes over, thereby facilitating the deposition of a material onto the upper surface of the substrate 108. In various examples, the material deposited onto the substrate 108 may be a group III, group IV, and/or group V material, or may be a material including a group III, group IV, and/or group V dopant. For example, the deposited material may include gallium arsenide, gallium nitride, or aluminum gallium nitride.

The lamps 102 may be adapted to heat the substrate 108 to a temperature within a range of about 200 degrees Celsius to about 1200 degrees Celsius, such as about 300 degrees Celsius to about 950 degrees Celsius. The lamps 102 may include bulbs 141 surrounded by an optional reflector 143.

Each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 conductively cools the lower dome 104 due in part to the close proximity of the lamphead 145 to the lower dome 104. The lamphead 145 may also cool the lamp walls and walls of the reflectors 143. If desired, the lampheads 145 may or may not be in contact with the lower dome 114.

A circular shield 167 may be optionally disposed around the substrate support 107 and coupled to sidewall of the chamber body 101. The shield 167 prevents or minimizes leakage of heat/light noise from the lamps 102 to the device side 116 of the substrate 108 in addition to providing a pre-heat zone for the process gases. The shield 167 may be made from CVD SiC coated sintered graphite, grown SiC, or a similar opaque material that is resistant to chemical breakdown by process and cleaning gases.

A reflector 122 may be optionally placed outside the upper dome 128 to reflect infrared light that is radiating off the substrate 108 back onto the substrate 108. Due to the reflected infrared light, the efficiency of the heating will be improved by containing heat that could otherwise escape the process chamber 100. The reflector 122 can be made of a metal such as aluminum or stainless steel. The reflector 122 can have machined channels 126 to carry a flow of a fluid such as water for cooling the reflector 122. If desired, the efficiency of the reflection can be improved by coating a reflector area with a highly reflective coating such as with gold.

A plurality of thermal radiation sensors 140, which may be pyrometers, are disposed in the lamphead 145 for measuring thermal emissions of the substrate 108. The sensors 140 are typically disposed at different locations in the lamphead 145 to facilitate viewing different locations of the substrate 108 during processing. Sensing thermal radiation from different locations of the substrate 108 facilitates comparing the thermal energy content, for example the temperature, at different locations of the substrate 108 to determine whether temperature anomalies or non-uniformities are present. Such non-uniformities can result in non-uniformities in film formation, such as thickness and composition. At least two sensors 140 are used, but more than two may be used. Different embodiments may use three, four, five, six, seven, or more sensors 140.

Each sensor 140 views a zone of the substrate 108 and senses the thermal state of a zone of the substrate. The zones may be oriented radially in some embodiments. For example, in embodiments where the substrate 108 is rotated, the sensors 140 may view, or define, a central zone in a central portion of the substrate 108 having a center substantially the same as the center of the substrate 108, with one or more zones surrounding the central zone and concentric therewith. It is not required that the zones be concentric and radially oriented, however. In some embodiments, zones may be arranged at different locations of the substrate 108 in non-radial fashion.

The sensors 140 are typically disposed between the lamps 102, for example in the channels 149, and are usually oriented substantially normal to the substrate 108. In some embodiments the sensors 140 are oriented normal to the substrate 108, while in other embodiments, the sensors 140 may be oriented in slight departure from normality. An orientation angled within about 5° of normal is most frequently used.

The sensors 140 may be attuned to the same wavelength or spectrum, or to different wavelengths or spectra. For example, substrates used in the chamber 100 may be compositionally homogeneous, or they may have domains of different compositions. Using sensors 140 attuned to different wavelengths may allow monitoring of substrate domains having different composition and different emission responses to thermal energy. Typically, the sensors 140 are attuned to infrared wavelengths, for example about 4 μm.

A top thermal sensor 118 may be disposed in the reflector 122 to monitor a thermal state of the upper dome 128, if desired, or to monitor the thermal state of the substrate 108 from a viewpoint opposite that of the sensors 140. Such monitoring may be useful to compare to data received from the sensors 140, for example to determine whether a fault exists in the data received from the sensors 140. The top thermal sensor 118 may be an assembly of sensors in some cases, featuring more than one individual sensor. Thus, the chamber 100 may feature one or more sensors disposed to receive radiation emitted from a first side of a substrate and one or more sensors disposed to receive radiation from a second side of the substrate opposite the first side.

A controller 160 receives data from the sensors 140 and separately adjusts power delivered to each lamp 102, or individual groups of lamps or lamp zones, based on the data. The controller 160 may include a power supply 162 that independently powers the various lamps or lamp zones. The controller 160 can be configured with a desired temperature profile, and based on comparing the data received from the sensors 140, the controller 160 adjusts power to lamps and/or lamp zones to conform the observed thermal data to the desired temperature profile. The controller 160 may also adjust power to the lamps and/or lamp zones to conform the thermal treatment of one substrate to the thermal treatment of another substrate, in the event chamber performance drifts over time.

Figure 2:
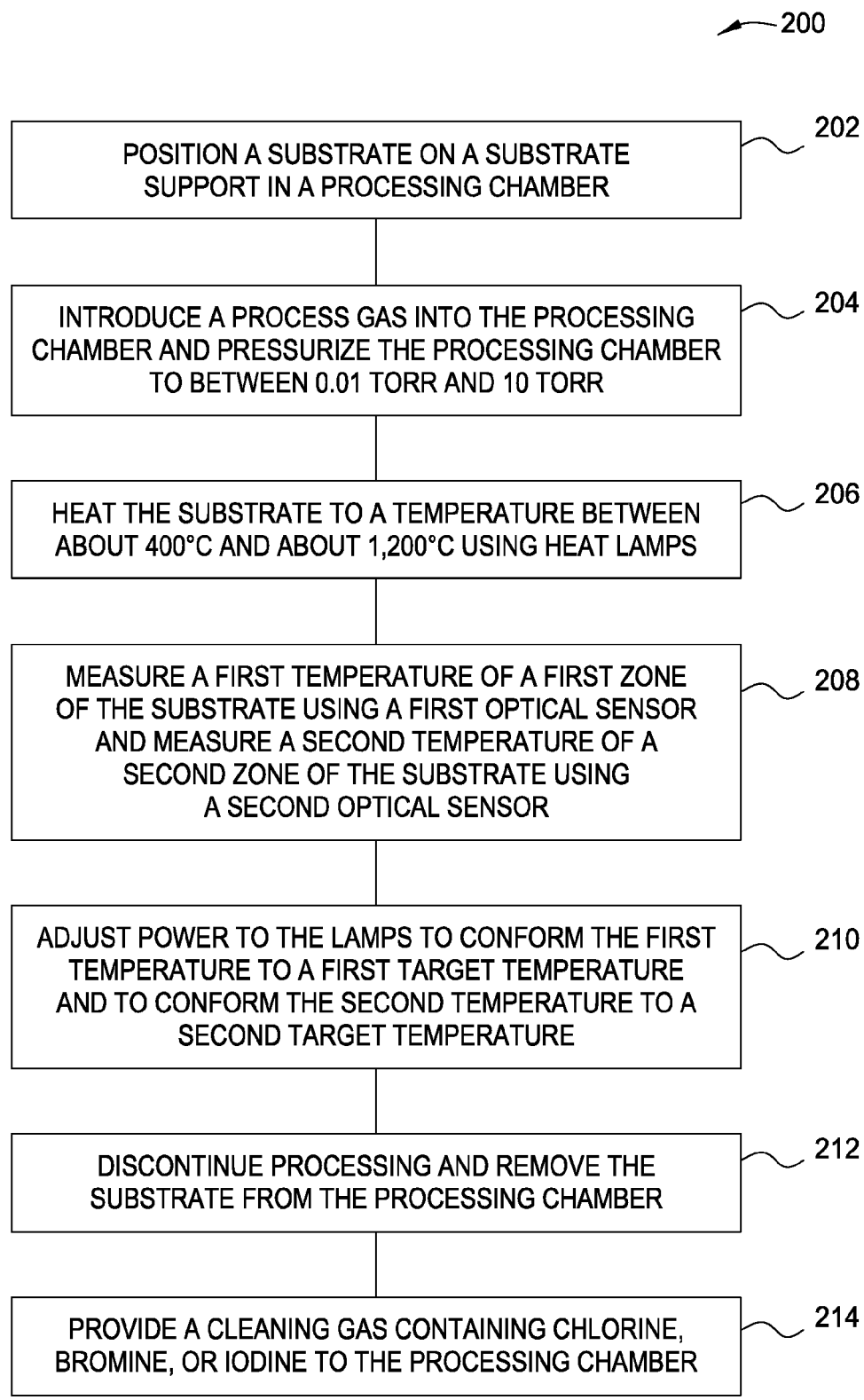
FIG. 2 is a flow diagram summarizing a method according to another embodiment.

FIG. 2 is a flow diagram summarizing a method 200 according to another embodiment. At 202, a substrate is positioned on a substrate support in a process chamber. The substrate support is substantially transparent to thermal radiation and has low thermal mass. Thermal lamps are positioned to provide heat to the substrate.

At 204, a process gas is introduced to the process chamber, and pressure of the process chamber is set between about 0.01 Torr and about 10 Torr. The process gas may be any gas from which a layer is to be formed on the substrate. The process gas may contain a group IV precursor and/or group III and group V precursors, from which a group IV material, such as silicon or germanium, or a group III/V compound material, such as aluminum nitride, may be formed. Mixtures of such precursors may also be used. The process gas is typically flowed with an unreactive diluent or carrier gas, and is typically provided in laminar or quasi-laminar flow substantially parallel to the substrate surface.

At 206, the substrate is heated to a temperature between about 400° C. and about 1,200° C., for example about 600° C. The precursors contact the heated substrate surface and form a layer on the substrate surface. The substrate may be rotated to improve uniformity of film properties.

At 208, a first temperature of a first zone of the substrate is measured by a first optical sensor and a second temperature of a second zone of the substrate is measured by a second optical sensor. The optical sensors may be pyrometers sensing intensity of radiation emitted by the substrate in the first and second zones. In some embodiments, the signals received from the optical sensors may be adjusted to compensate for background radiation emanating from the lamps and reflected from the substrate. The substrate reflectivity as a function of temperature, along with the known intensity of light emitted by the lamps, may be used to model the intensity of reflected light, and the modeled intensity used to adjust the signals from the optical sensors to improve the signal to noise ratio of the sensors.

At 210, power to the lamps is adjusted based on the first temperature and the second temperature readings to conform the first temperature to a first target temperature and to conform the second temperature to a second target temperature. The first and second target temperatures may be the same or different. For example, to compensate for faster film formation at an edge of the substrate than at the center of the substrate, the first temperature may be measured at the center of the substrate, the second temperature may be measured at the edge of the substrate, and lamp power adjusted to provide a higher substrate temperature at the center than at the edge of the substrate. More than two zones may be used to monitor temperatures at more than two locations on the substrate to increase the specificity of local temperature control, if desired.

At 212, processing is stopped and the substrate is removed from the process chamber. At 214, a cleaning gas is provided to the chamber to remove deposits from chamber surfaces. Removing the deposits corrects reduction in transmissivity of chamber components to lamp radiation and to substrate emissions, maintaining repeatability of film properties from substrate to substrate. The cleaning gas is typically a gas containing chlorine, bromine, or iodine. Gases such as $Cl_2$, $Br_2$, $I_2$, HCl, HBr, and HI are often used. When elemental halogens are used, temperature of the chamber may be held approximately constant, or increased slightly, to clean the chamber. When hydrogen halides are used, temperature of the chamber is typically increased to compensate for reduced concentration of halogen cleaning agents. Temperature of the chamber during cleaning with hydrogen halides may be increased to between about 800° C. and about 1,200° C., for example about 900° C. After cleaning from 30 seconds to 10 minutes, depending on the desired cleaning result, another substrate may be processed.

While the foregoing is directed to embodiments of the present invention, other and further embodiments of the invention may be devised without departing from the basic scope thereof, and the scope thereof is determined by the claims that follow.

The invention claimed is:

1. A substrate processing apparatus, comprising:
   a vacuum chamber comprising a transparent dome and a transparent floor, wherein both the transparent dome and the transparent floor are quartz;
   a substrate support disposed inside the vacuum chamber, wherein the substrate support is a platter-like member with low thermal mass;
   a plurality of thermal lamps arranged in a lamphead and positioned proximate the transparent floor of the vacuum chamber;
   a plurality of thermal sensors disposed within the lamphead and oriented to receive thermal radiation from an area proximate the substrate support, wherein the thermal sensors receive thermal radiation through the transparent floor, and wherein the thermal sensors receive thermal radiation emitted by the substrate and transmitted by the substrate support;
   a plurality of power supplies coupled to the thermal lamps in relation to the position of the thermal sensors;
   a controller that adjusts the power supplies based on input from the thermal sensors; and a reflector disposed proximate the transparent dome, the reflector and the transparent dome together defining a thermal control space.

2. The substrate processing apparatus of claim 1, further comprising an inlet for a thermal control fluid disposed through the reflector in fluid communication with the thermal control space, and an outlet for the thermal control fluid disposed through the reflector and in fluid communication with the thermal control space.

3. The substrate processing apparatus of claim 1, further comprising a thermal sensor disposed proximate the transparent dome.

4. The substrate processing apparatus of claim 3, wherein the thermal sensor is disposed in the reflector.

5. A substrate processing apparatus, comprising:
   a vacuum chamber comprising a transparent dome and a transparent floor;
   a substrate support disposed inside the vacuum chamber, wherein the substrate support is a platter-like member with low thermal mass;
   a plurality of thermal lamps arranged in a lamphead and positioned proximate the transparent floor of the vacuum chamber;
   a plurality of thermal sensors disposed within the lamphead and oriented to receive thermal radiation from an area proximate the substrate support, wherein the thermal sensors receive thermal radiation through the transparent floor, and wherein the thermal sensors receive thermal radiation emitted by the substrate and transmitted by the substrate support;
   a plurality of power supplies coupled to the thermal lamps in relation to the position of the thermal sensors;
   a controller that adjusts the power supplies based on input from the thermal sensors;
   a reflector disposed proximate the transparent dome, the reflector and the transparent dome together defining a thermal control space; and
   an inlet for a thermal control fluid disposed through the reflector in fluid communication with the thermal control space, and an outlet for the thermal control fluid disposed through the reflector and in fluid communication with the thermal control space.

6. The substrate processing apparatus of claim 5, further comprising a thermal sensor disposed proximate the transparent dome.

7. The substrate processing apparatus of claim 6, wherein the thermal sensor is disposed in the reflector.

8. A substrate processing apparatus, comprising:
   a vacuum chamber comprising a transparent dome and a transparent floor;
   a substrate support disposed inside the vacuum chamber, wherein the substrate support is a platter-like member with low thermal mass;
   a plurality of thermal lamps arranged in a lamphead and positioned proximate the transparent floor of the vacuum chamber;
   a plurality of first thermal sensors disposed within the lamphead and oriented to receive thermal radiation from an area proximate the substrate support, wherein the first thermal sensors receive thermal radiation through the transparent floor, and wherein the first thermal sensors receive thermal radiation emitted by the substrate and transmitted by the substrate support;
   a plurality of power supplies coupled to the thermal lamps in relation to the position of the first thermal sensors;
   a controller that adjusts the power supplies based on input from the first thermal sensors;
   a reflector disposed proximate the transparent dome, the reflector and the transparent dome together defining a thermal control space; and
   a second thermal sensor disposed proximate the transparent dome.

9. The substrate processing apparatus of claim 8, wherein the second thermal sensor is disposed in the reflector.

* * * * *